United States Patent
Mikami et al.

(10) Patent No.: US 8,435,870 B2
(45) Date of Patent: May 7, 2013

(54) METHOD FOR MANUFACTURING SEMICONDUCTOR DEVICE

(75) Inventors: Mayumi Mikami, Kanagawa (JP); Konami Izumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 506 days.

(21) Appl. No.: 12/767,108

(22) Filed: Apr. 26, 2010

(65) Prior Publication Data

US 2010/0273319 A1    Oct. 28, 2010

(30) Foreign Application Priority Data

Apr. 27, 2009   (JP) ................................. 2009-108129

(51) Int. Cl.
*H01L 21/768* (2006.01)
*H01L 21/20* (2006.01)

(52) U.S. Cl.
USPC ...... 438/479; 438/149; 438/458; 257/E21.09; 257/E21.585

(58) Field of Classification Search ............... 438/149, 438/458, 479
See application file for complete search history.

(56) References Cited

U.S. PATENT DOCUMENTS

| | | | |
|---|---|---|---|
| 5,757,456 A | 5/1998 | Yamazaki et al. | |
| 5,952,722 A * | 9/1999 | Watanabe | 257/754 |
| 7,037,752 B2 | 5/2006 | Kuwabara et al. | |
| 7,422,935 B2 | 9/2008 | Yamazaki | |
| 7,485,838 B2 | 2/2009 | Nishi et al. | |
| 7,683,838 B2 | 3/2010 | Koyama et al. | |
| 7,785,938 B2 | 8/2010 | Yamaguchi et al. | |
| 2005/0151228 A1* | 7/2005 | Tanida et al. | 257/620 |
| 2007/0229271 A1 | 10/2007 | Shionoiri et al. | |
| 2007/0284721 A1 | 12/2007 | Sakamoto | |
| 2009/0114926 A1* | 5/2009 | Yamazaki | 257/79 |
| 2010/0213531 A1* | 8/2010 | Asami et al. | 257/316 |
| 2010/0282947 A1* | 11/2010 | Yamazaki et al. | 250/214 A |
| 2010/0289037 A1* | 11/2010 | Matsumoto et al. | 257/88 |
| 2010/0320496 A1* | 12/2010 | Nishi et al. | 257/98 |
| 2012/0091543 A1* | 4/2012 | Torashima et al. | 257/415 |
| 2012/0248581 A1* | 10/2012 | Sugiyama et al. | 257/622 |
| 2012/0261802 A1* | 10/2012 | Ohmi et al. | 257/628 |
| 2012/0264247 A1* | 10/2012 | Peng et al. | 438/46 |

FOREIGN PATENT DOCUMENTS

| | | |
|---|---|---|
| JP | 08-254686 A | 10/1996 |
| JP | 11-261001 A | 9/1999 |
| JP | 2003-336016 A | 11/2003 |
| JP | 2004-221568 A | 8/2004 |

(Continued)

*Primary Examiner* — Alexander Ghyka
(74) *Attorney, Agent, or Firm* — Fish & Richardson P.C.

(57) ABSTRACT

A method for manufacturing a semiconductor device includes: forming a first and second layers not firmly adhering to each other over a substrate; forming a first semiconductor element layer and a first insulating layer over the second layer; forming a hole reaching the first layer in the first insulating layer; oxidizing the first layer exposed at a bottom of the hole; forming a wiring electrically connected to the first semiconductor element layer over the first insulating layer and in the hole; and separating the first layer and the substrate from the second layer and the first semiconductor element layer and expose the wiring. Further, another method includes providing an anisotropic conductive adhesive between a second semiconductor element layer separated through a manufacturing process similar to the above and the wiring, whereby the first and second semiconductor element layers are electrically connected through the anisotropic conductive adhesive and the wiring.

11 Claims, 9 Drawing Sheets

FOREIGN PATENT DOCUMENTS

| | | |
|---|---|---|
| JP | 3579492 A | 10/2004 |
| JP | 2006-121062 A | 5/2006 |
| JP | 2007-059889 A | 3/2007 |
| JP | 2007-280368 A | 10/2007 |
| JP | 2007-317969 A | 12/2007 |
| JP | 2007-318106 A | 12/2007 |
| JP | 4063944 A | 3/2008 |
| JP | 2008-217776 A | 9/2008 |

* cited by examiner

METHOD FOR MANUFACTURING SEMICONDUCTOR DEVICE

BACKGROUND OF THE INVENTION

1. Field of the Invention

The invention disclosed in this specification relates to a method for manufacturing a semiconductor device.

2. Description of the Related Art

In recent years, a technique for transferring a semiconductor element formed over an insulating substrate has been developed. As an example of such a technique, there is a technique which includes the steps of providing a separation layer between a semiconductor element and an insulating substrate and separating the semiconductor element from the insulating substrate by removing the separation layer (Patent Documents 1 and 2).

In addition, there is a technique for manufacturing a three-dimensional semiconductor device by stacking separated thin film integrated circuits (Patent Document 3).

[Reference]
[Patent Document]
[Patent Document 1] Japanese Published Patent Application No. 2006-121062
[Patent Document 2] Japanese Published Patent Application No. 2007-280368
[Patent Document 3] Japanese Published Patent Application No. H08-254686

SUMMARY OF THE INVENTION

When a semiconductor element which is separated through the separation process as described above is stacked over and electrically connected to another element, a connection wiring for connection to the outside has to be exposed in the separation process. Therefore, it is necessary to carry out the separation at the interface between the separation layer and the connection wiring so that the connection wiring can be exposed.

However, particularly when metal films are used for the separation layer and the connection wiring, the separation layer and the connection wiring are not separated from each other in some cases since the separation layer and the connection wiring firmly adhere to each other. Even when the separation layer and the connection wiring are separated from each other, there is a concern that the connection wiring is not exposed at the surface where separation has occurred.

In addition, when the separation layer and the connection wiring firmly adhere to each other, the entire semiconductor element is not separated from the substrate in some cases. Even when the semiconductor element is separated from the substrate, there is a concern that the connection wiring is not exposed at the surface where separation has occurred, and thus, the semiconductor element cannot be electrically connected to another element which is stacked therebelow. Accordingly, a three-dimensional semiconductor device cannot be manufactured in some cases.

In order to form a connection wiring, a through hole is formed first in an insulating layer such that a separation layer is exposed at the bottom of the through hole. Then, the separation layer exposed at the bottom of the through hole is subjected to an oxidation process. Through this process, the adhesion between the exposed surface of the separation layer and the connection wiring can be lowered.

When the adhesion between the surface of the separation layer and the connection wiring is lowered through the oxidation process performed on the separation layer exposed at the bottom of the through hole, the entire semiconductor element can be completely separated from the substrate. By stacking semiconductor element layers each having such a connection wiring, a three-dimensional semiconductor device can be manufactured.

A method for manufacturing a semiconductor device is as follows. A first layer and a second layer which do not firmly adhere to each other are formed over a first substrate. A first semiconductor element layer and a first insulating layer are formed over the second layer. A through hole reaching the first layer is formed in the first insulating layer. The first layer exposed at a bottom of the through hole is oxidized. A wiring electrically connected to the first semiconductor element layer is formed over the first insulating layer and in the through hole. The first layer and the second layer are separated from each other, whereby the second layer, the first semiconductor element layer, the first insulating layer, and the wiring are separated from the first substrate, and the wiring is exposed.

Another method for manufacturing a semiconductor device is as follows. A first layer and a second layer which do not firmly adhere to each other are formed over a first substrate. A first semiconductor element layer and a first insulating layer are formed over the second layer. A through hole reaching the first layer is formed in the first insulating layer. The first layer exposed at a bottom of the through hole is oxidized. A wiring electrically connected to the first semiconductor element layer is formed over the first insulating layer and in the through hole. The first layer and the second layer are separated from each other, whereby the second layer, the first semiconductor element layer, the first insulating layer, and the wiring are separated from the first substrate, and the wiring is exposed. Further, a third layer and a fourth layer which do not firmly adhere to each other are formed over a second substrate. A second semiconductor element layer is formed over the fourth layer. The third layer and the fourth layer are separated from each other to separate the fourth layer and the second semiconductor element layer from the second substrate. An anisotropic conductive adhesive is provided between the second semiconductor element layer and the wiring. The first semiconductor element layer and the second semiconductor element layer are electrically connected to each other through the anisotropic conductive adhesive and the wiring.

The first layer and the third layer are each a tungsten film, and the second layer and the fourth layer are each a silicon oxide film.

The oxidation process is a process of soaking in a hydrogen peroxide solution or a process of irradiation with oxygen plasma.

It is possible to suppress incomplete separation in a separation process and prevent the reliability of a semiconductor device from lowering.

DETAILED DESCRIPTION OF THE INVENTION

Figure 1A:
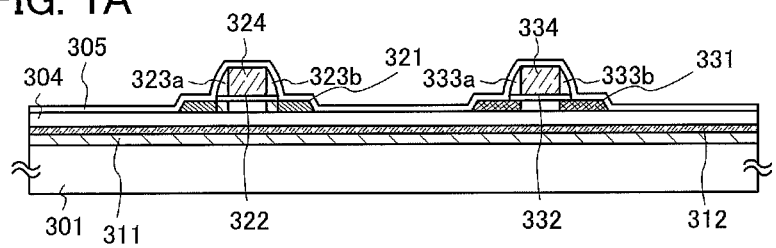
FIGS. 1A to 1D are cross-sectional views illustrating a manufacturing process of a semiconductor device.

Embodiments of the invention disclosed in this specification will be hereinafter described with reference to the accompanying drawings. Note that the invention disclosed in this specification can be carried out in a variety of modes, and it is easily understood by those skilled in the art that modes and details of the invention can be changed in various ways without departing from the spirit and the scope thereof. Therefore, the invention disclosed in this specification is not construed as being limited to the description of the embodiments. Note that, in the drawings hereinafter shown, the same portions or portions having similar functions are denoted by the same reference numerals, and repeated description thereof will be omitted.

Note that in the invention disclosed in this specification, a semiconductor device refers to an element or a device which functions by utilizing a semiconductor and includes, in its category, an electric device including an electronic circuit, a display device, a light-emitting device, and the like and an electronic appliance on which the electric device is mounted.

[Embodiment 1]

This embodiment will be described with reference to FIGS. 1A to 1D and FIGS. 2A to 2C.

First, a first layer 311 and a second layer 312 which do not firmly adhere to each other are stacked over a substrate 301. A process of separating a semiconductor element layer 302 which will be described later from the substrate 301 is carried out by separation at the interface between the first layer 311 and the second layer 312.

As the first layer 311 and the second layer 312, for example, a metal film, a silicon oxide film, and the like can be used. Specifically, by a sputtering method, a tungsten film or a molybdenum film may be formed as the first layer 311, and a silicon oxide film may be formed as the second layer 312. Alternatively, a combination of films whose adhesion to each other is not relatively low at the time of deposition but lowered by the process after the deposition may be employed. For example, an amorphous silicon film and a silicon oxide film are stacked as the first layer 311 and the second layer 312, respectively. After deposition of these films, heating is performed or laser beam irradiation is performed from the back of the substrate 301, so that the amorphous silicon film is crystallized, and the adhesion between the silicon film which is crystallized and the silicon oxide film is lowered.

Next, over the first layer 311 and the second layer 312, a base layer 304, an island-like semiconductor film 321, a gate insulating film 322, a gate electrode 324, a sidewall 323a, a sidewall 323b, an island-like semiconductor film 331, a gate insulating film 332, a gate electrode 334, a sidewall 333a, and a sidewall 333b are formed. The island-like semiconductor film 321 and the island-like semiconductor film 331 each contain an impurity element imparting one conductivity type and include a channel formation region, a high-concentration impurity region, and a low-concentration impurity region as needed.

A protective layer 305 is formed so as to cover the island-like semiconductor film 321, the gate insulating film 322, the gate electrode 324, the sidewall 323a, the sidewall 323b, the island-like semiconductor film 331, the gate insulating film 332, the gate electrode 334, the sidewall 333a, and the sidewall 333b (FIG. 1A).

An insulating film 307 is formed over the protective layer 305. In addition, a through hole 315 is formed in a stack including the second layer 312, the base layer 304, the protective layer 305, and the insulating film 307.

When the through hole 315 penetrates also the first layer 311, there is a concern that the separation process cannot be performed afterwards. Therefore, the through hole 315 is formed so as not to remove the first layer 311.

Figure 1B:
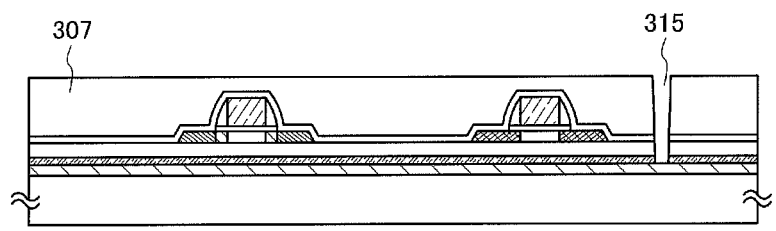
Figure 1C:
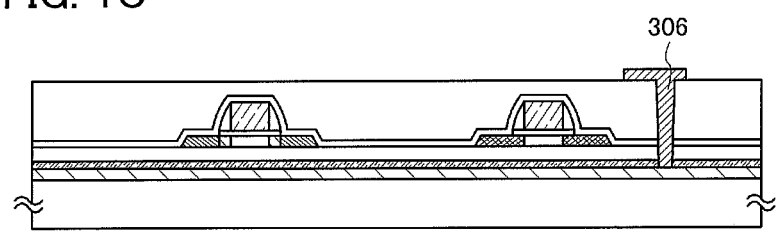

Next, a surface of the first layer 311, which is exposed at the bottom of the through hole 315, is oxidized. In order to oxidize the surface of the first layer 311, a method of performing soaking in a solution having oxidizability such as a hydrogen peroxide solution, a method of performing irradiation with oxygen plasma (also referred to as $O_2$ ashing), or the like may be used. When the size of the bottom of the through hole 315 is small, there is a concern that a solution having oxidizability such as a hydrogen peroxide solution does not reach a lower part of the through hole 315; thus, it is preferable to perform irradiation with oxygen plasma (FIG. 1B).

Then, a wiring 306 is formed so as to be in contact with the first layer 311 through the through hole 315 (FIG. 1C) The wiring 306 may comprise any one of aluminum, a stack of titanium and aluminum, and copper.

Next, contact holes which reach the island-like semiconductor film 321 and contact holes which reach the island-like semiconductor film 331 are formed in the protective layer 305 and the insulating film 307. A wiring 316a and a wiring 316b which are in contact with the island-like semiconductor film 321 through the contact holes are formed. In addition, the wiring 316b and a wiring 316c which are in contact with the island-like semiconductor film 331 through the contact holes are formed. Note that the wiring 316c is electrically connected to the wiring 306.

Figure 1D:
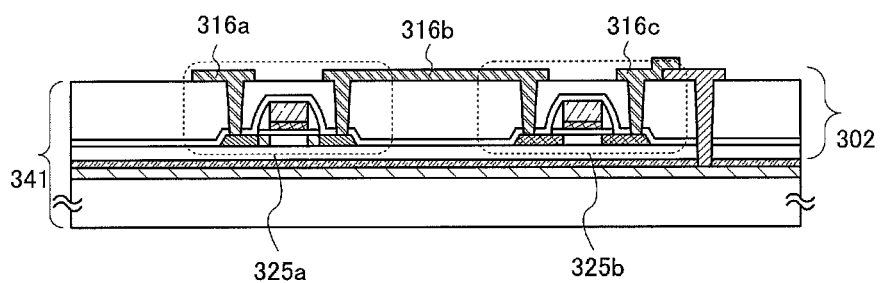

In the above manner, a thin film transistor (TFT) 325a including the island-like semiconductor film 321, the gate insulating film 322, the gate electrode 324, the sidewall 323a, the sidewall 323b, the wiring 316a, and the wiring 316b is formed. In addition, a TFT 325b including the island-like semiconductor film 331, the gate insulating film 332, the gate electrode 334, the sidewall 333a, the sidewall 333b, the wiring 316b, and the wiring 316c is formed. In this embodiment, a stack including the base layer 304, the TFT 325a, the TFT 325b, the protective layer 305, and the insulating film 307 is referred to as a semiconductor element layer 302. In addition, the substrate 301 and the semiconductor element layer 302 are collectively referred to as a stack structure body 341 (FIG. 1D).

Figure 2A:
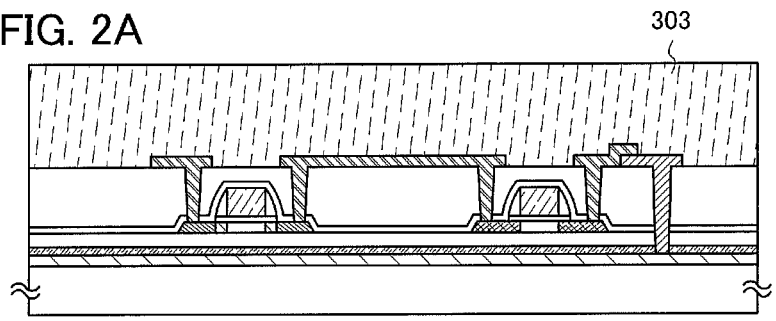
FIGS. 2A to 2C are cross-sectional views illustrating a manufacturing process of a semiconductor device.

Next, a planarization film 303 is formed over the semiconductor element layer 302 (FIG. 2A). The planarization film 303 may be formed using an organic resin such as an epoxy resin, for example.

A supporting substrate 309 which can be removed in a step carried out later is attached to the surface of the planarization film 303 using an adhesive 308.

When a flexible substrate is used as the supporting substrate 309, the semiconductor element layer 302 and the like can be separated from the substrate 301 efficiently without being damaged. In addition, a thermoplastic resin or a photoplastic resin can be used for the adhesive 308.

Figure 2B:
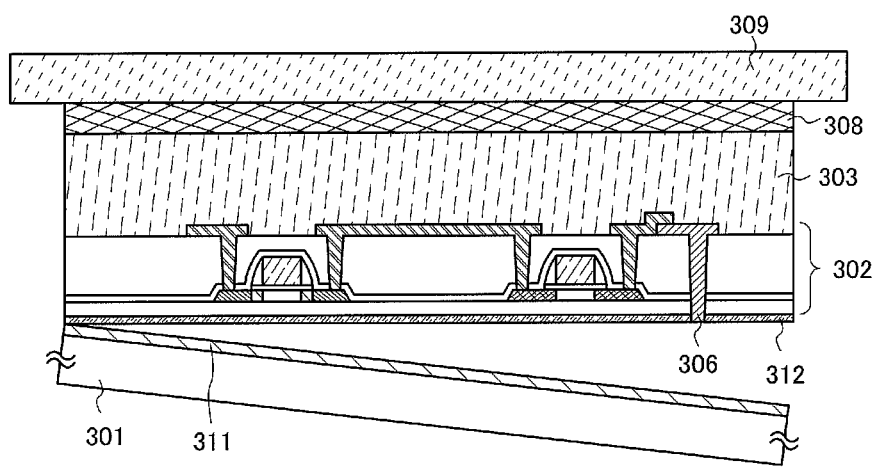

Then, a process of separating the semiconductor element layer 302 and the wiring 306 from the substrate 301 is carried out (FIG. 2B). This separation process is performed by separating the first layer 311 and the second layer 312 from each other at the interface therebetween. The first layer 311 remains over the substrate 301, and the second layer 312 is attached to the semiconductor element layer 302 which is separated. The semiconductor element layer 302 and the wiring 306 are separated from the substrate 301 as described above, and the wiring 306 is exposed at the surface which has been in contact with the substrate 301.

Figure 2C:
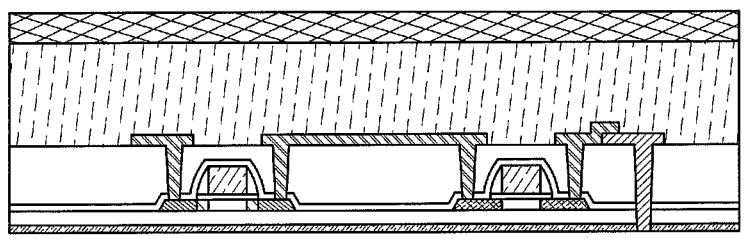

Then, the supporting substrate 309 is removed (FIG. 2C). The adhesive 308 may also be removed if possible.

Through the forgoing process, a semiconductor device in which the wiring 306 is exposed can be manufactured.

[Embodiment 2]

This embodiment will be described with reference to FIGS. 3A and 3B, FIGS. 8A and 8B, and FIGS. 9A to 9D.

First, a process of separating the semiconductor element layer 302 and the wiring 306 from the substrate 301 is carried out in accordance with the manufacturing process described in Embodiment 1 with reference to FIGS. 1A to 1D and FIGS. 2A and 2B. Note that FIG. 3A corresponds to FIG. 2B.

Figure 3A:
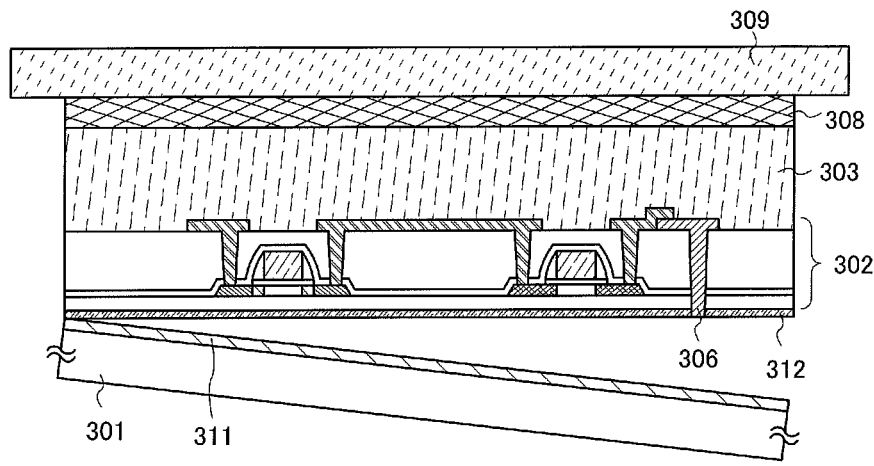
FIGS. 3A and 3B are cross-sectional views illustrating a manufacturing process of a semiconductor device.
Figure 3B:
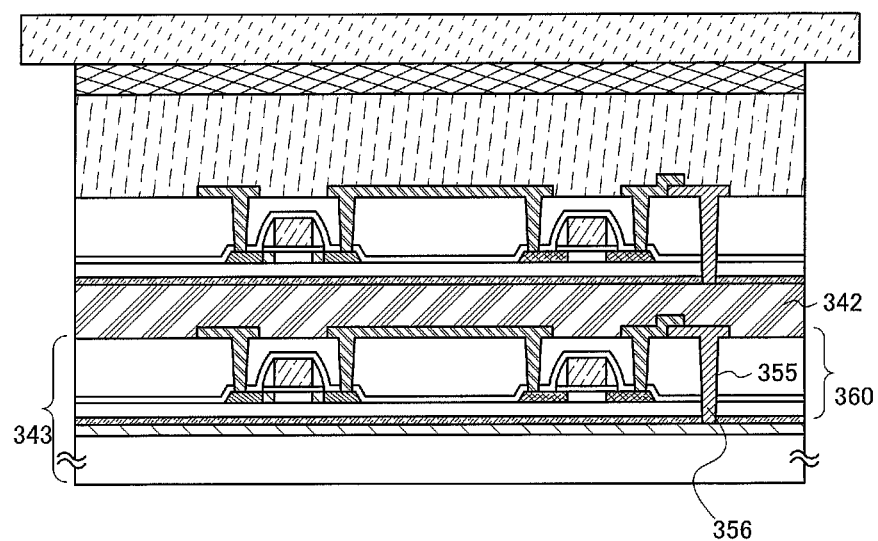

Then, the second layer 312, the semiconductor element layer 302, and the wiring 306 which are separated are attached to another stack structure body 343 using an anisotropic conductive adhesive (e.g. ANISOLM) 342 (FIG. 3B). The stack structure body 343 may have a structure which is the same as or different from that of the stack structure body 341 shown in FIGS. 1D and 3B. Through the above process, the semiconductor element layer 302 is electrically connected to a semiconductor element layer 360 in the stack structure body 343 which is newly attached through the anisotropic conductive adhesive 342. Note that a through hole 355 and a wiring 356 are not necessarily formed in the stack structure body 343 which is newly attached when it is placed as the lowermost layer.

Figure 8A:
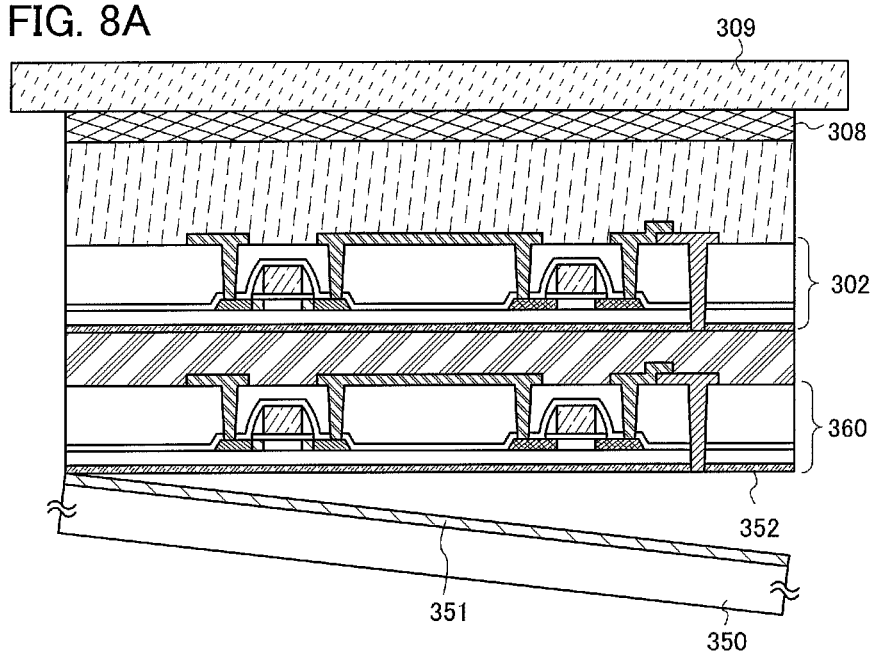
FIGS. 8A and 8B are cross-sectional views illustrating a manufacturing process of a semiconductor device.

By separating, at the interface, a first layer 351 and a second layer 352 in the stack structure body 343 which is newly attached, a substrate 350 and the first layer 351 in the stack structure body 343 which is newly attached are separated from a stack including the second layer 352 and the semiconductor element layers 302 and 360, the adhesive 308, and the supporting substrate 309 (FIG. 8A).

Figure 8B:
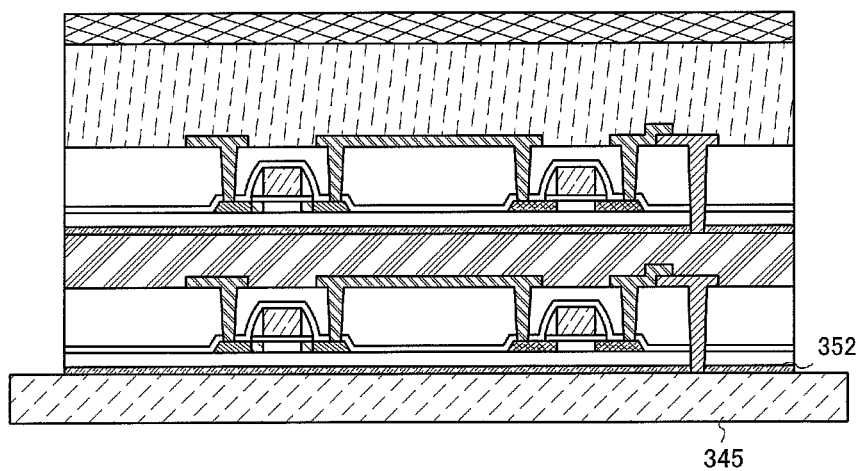

The exposed second layer 352 is attached to a flexible substrate 345, and the supporting substrate 309 is removed (FIG. 8B).

Figure 9A:
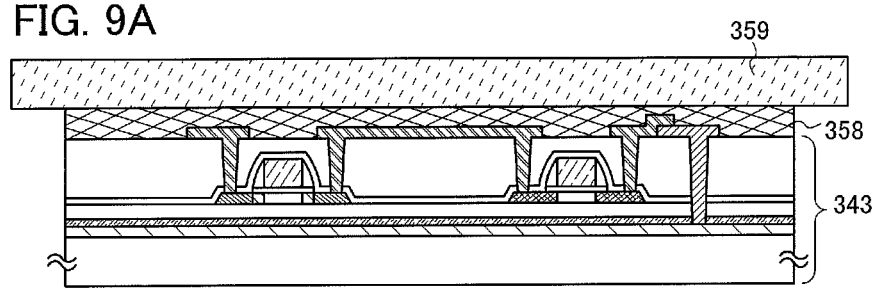
FIGS. 9A to 9D are cross-sectional views illustrating a manufacturing process of a semiconductor device.

Another manufacturing method for obtaining a structure which is similar to that illustrated in FIG. 8B will be described below. First, a stack structure body 343 is newly manufactured, and an adhesive 358 and a supporting substrate 359 are provided over the stack structure body 343 (FIG. 9A).

Figure 9B:
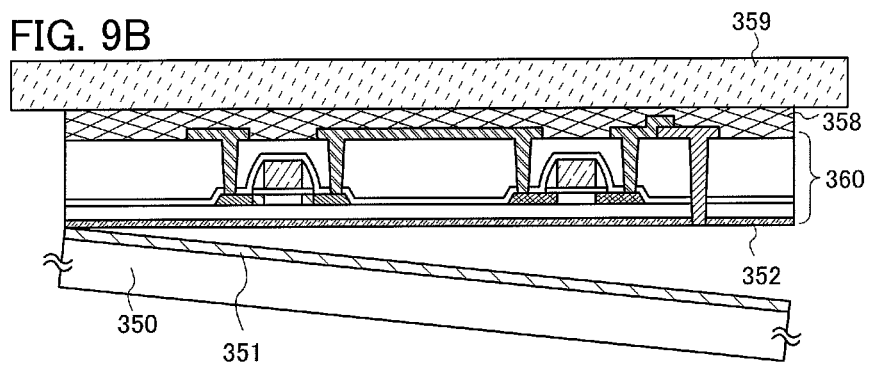
Figure 9C:
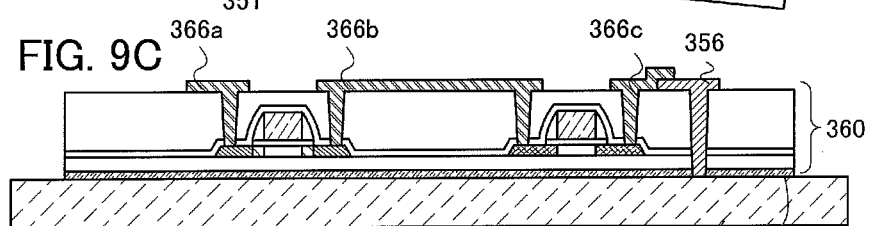

Next, a substrate 350 and a first layer 351 in the stack structure body 343 are separated from a second layer 352, a semiconductor element layer 360, the adhesive 358, and the supporting substrate 359 (FIG. 9B).

The adhesive 308 and the supporting substrate 309 are removed from a second layer 352, the semiconductor element layer 360, the adhesive 358, and the supporting substrate 359, whereby a wiring 366a, a wiring 366b, a wiring 366c, and a wiring 356 are exposed. Then, the second layer 352 is attached to a flexible substrate 345.

Figure 9D:
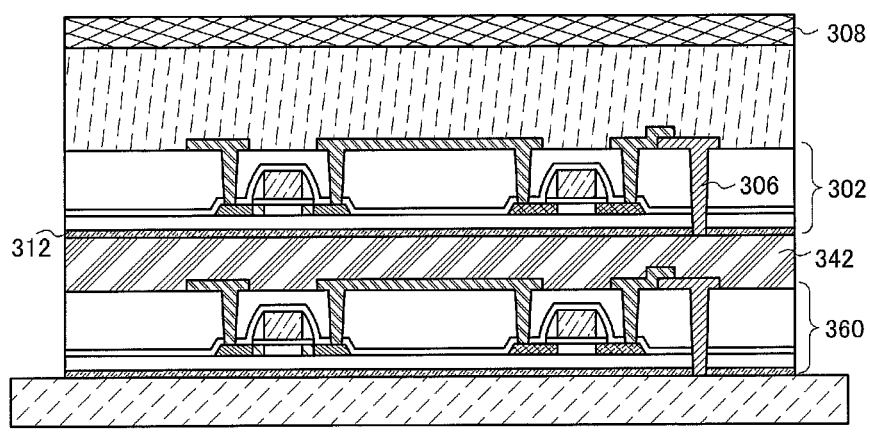

Then, a second layer 312, a semiconductor element layer 302, a wiring 306, and an adhesive 308 from which a substrate 301 and a first layer 311 are separated in the step of FIG. 2A may be attached to the flexible substrate 345, the second layer 352, the semiconductor element layer 360, and the wiring 356 which are newly formed with an anisotropic conductive adhesive 342, whereby a semiconductor device illustrated in FIG. 9D can be manufactured. Note that FIG. 9D corresponds to FIG. 8B.

In the above-described manner, a three-dimensional semiconductor device including the semiconductor elements which are electrically connected to each other through the wirings 306 can be manufactured.

EXAMPLE 1

This example will be described with reference to FIGS. 4A to 4E, FIGS. 5A and 5B, FIGS. 6A and 6B, and FIGS. 7A and 7B.

Figure 4A:
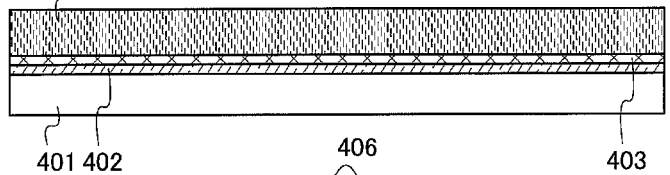
FIGS. 4A to 4E are cross-sectional views illustrating a manufacturing process of a semiconductor device.
Figure 4B:
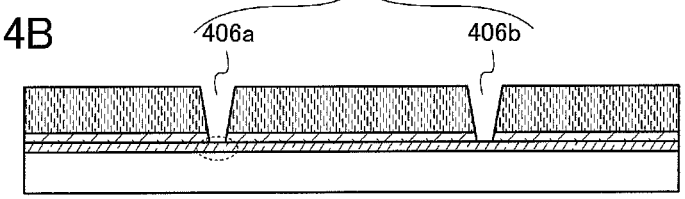

First, a first layer 402, a second layer 403, and an insulating layer 405 are formed over a substrate 401 (FIG. 4A). In this example, a tungsten film is formed as the first layer 402 by a sputtering method. In addition, a silicon oxide film is formed as the second layer 403. Further, a stack film obtained by stacking a silicon nitride film containing oxygen and a silicon oxide film is used as the insulating layer 405.

A through hole 406a and a through hole 406b are formed in the insulating layer 405 and the second layer 403 by a dry etching method. In this example, the through hole 406a and the through hole 406b are collectively referred to as a through hole 406.

Figure 4C:
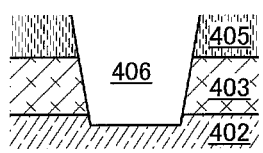

As an oxidation process, $O_2$ ashing is performed on the first layer 402 which is exposed at the bottom of the through hole 406. By this $O_2$ asking, the first layer 402 which is exposed at the bottom of the through hole 406 is partly removed (FIG. 4C).

Figure 4D:
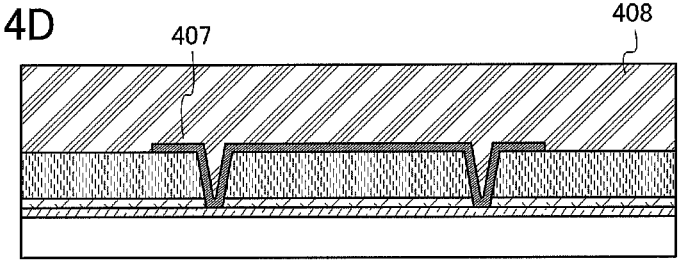

A wiring 407 is formed over the insulating layer 405 and in the through hole 406. Then, an insulating layer 408 is formed over the insulating layer 405 and the wiring 407 (FIG. 4D).

Figure 4E:
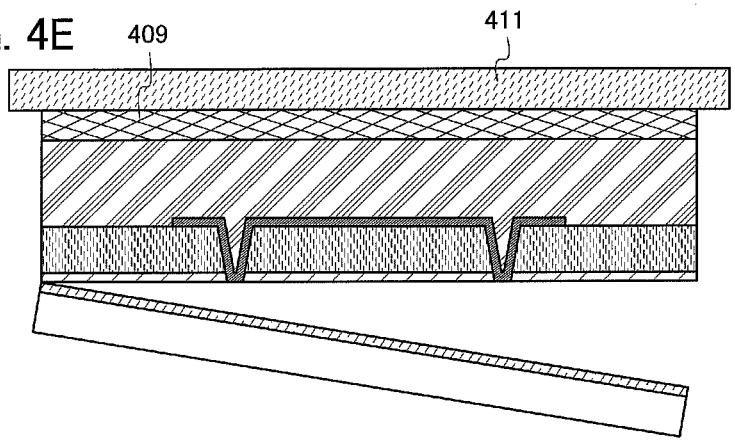

A planarization film 409 is formed over the insulating layer 408, and a supporting substrate 411 which can be removed later is attached to the planarization film 409. Next, the insulating layer 405, the wiring 407, the insulating layer 408, the planarization film 409, and the supporting substrate 411 are separated from the substrate 401 (FIG. 4E). This separation process is carried out by separation at the interface between the first layer 402 and the second layer 403.

Figure 6A:
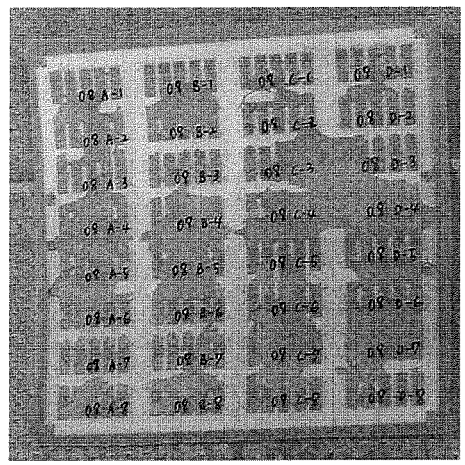
FIGS. 6A and 6B are images each showing a state after a separation process.
Figure 6B:
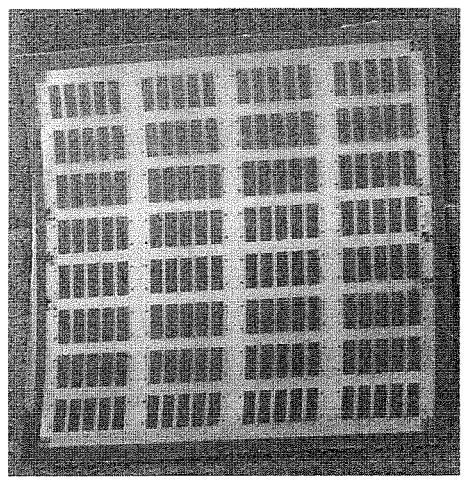

Here, a substrate which has been subjected to the separation process after performing $O_2$ ashing and a substrate which has been subjected to the separation process without performing $O_2$ ashing were compared as illustrated in FIGS. 6A and 6B.

The substrate in FIG. 6A has been subjected to the separation process without performing $O_2$ ashing, whereas the substrate in FIG. 6B has been subjected to the separation process after performing $O_2$ ashing. It is found that the separation has not succeeded in the substrate in FIG. 6A and there is a region where a material to be separated remains over the substrate.

Figure 5A:
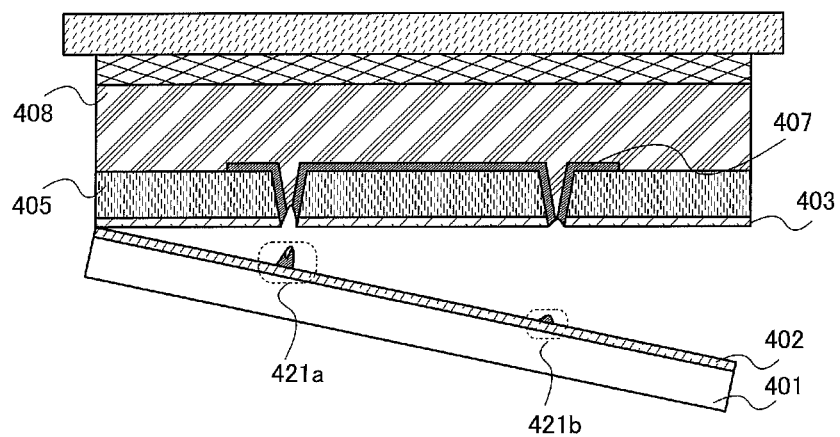
FIGS. 5A and 5B are cross-sectional views illustrating a manufacturing process of a semiconductor device.

When the separation of the first layer 402 and the wiring 407 does not succeed in the separation process, part of the insulating layer 408 which is provided around the wiring 407 as well as part of the wiring 407 remains over the substrate 401, being attached to the first layer 402 (FIG. 5A).

Figure 5B:
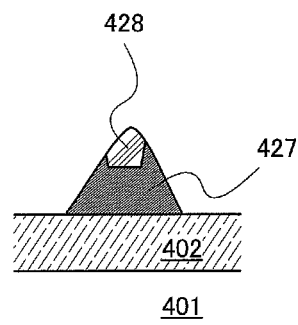

In FIG. 5A, part of the wiring 407 which is attached to the first layer 402 is referred to as a region 421b, and part of the wiring 407 and part of the insulating layer 408 which are attached to the first layer 402 are referred to as a region 421a. The region 421a and the region 421b are collectively referred to as a region 421. FIG. 5B is an enlarged view of the region 421a. The region 421a includes a wiring 427 which is part of the wiring 407 and an insulating layer 428 which is part of the insulating layer 408. In this manner, since the wiring 427 and the insulating layer 428 which should be separated remain over the substrate 401, there is a concern that the obtained semiconductor device does not function as an element.

Figure 7A:
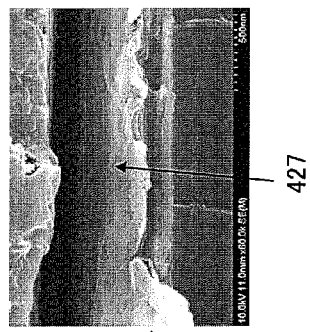
FIGS. 7A and 7B are images each showing a state after a separation process.
Figure 7B:
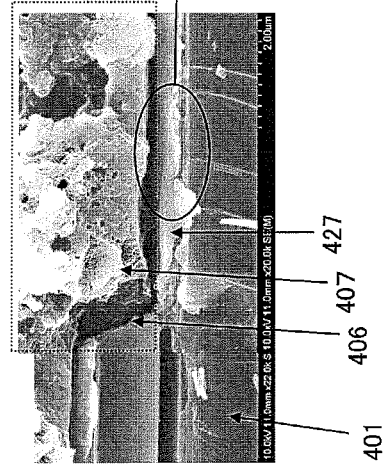

FIGS. 7A and 7B are SEM images each showing a region which has not been separated in the separation process without $O_2$ ashing and which remains over the substrate 401.

In FIG. 7A, the wiring 427 which is part of the wiring 407 remains over the substrate 401. FIG. 7B is an enlarged image of FIG. 7A and clearly shows that the wiring 427 remains over the substrate 401.

This application is based on Japanese Patent Application serial no. 2009-108129 filed with Japan Patent Office on Apr. 27, 2009, the entire contents of which are hereby incorporated by reference.

What is claimed is:

1. A method for manufacturing a semiconductor device, comprising the steps of:
    forming a first layer over a first substrate;
    forming a second layer on the first layer;
    forming a first semiconductor element layer over the second layer;
    forming a first insulating layer over the first semiconductor element layer;
    forming a through hole reaching the first layer in the first insulating layer;
    oxidizing a portion of the first layer which is exposed at a bottom of the through hole,
    forming a wiring electrically connected to the first semiconductor element layer over the first insulating layer and in the through hole; and
    separating the first layer and the first substrate from the second layer, the first semiconductor element layer, the first insulating layer, and the wiring, thereby exposing a portion of the wiring.

2. The method for manufacturing a semiconductor device, according to claim 1,
    wherein the first layer comprises tungsten, and
    wherein the second layer comprises silicon oxide.

3. The method for manufacturing a semiconductor device, according to claim 1, wherein the oxidizing is performed by soaking in a hydrogen peroxide solution or by irradiation with oxygen plasma.

4. A method for manufacturing a semiconductor device, comprising the steps of:
    forming a first layer over a first substrate;
    forming a second layer on the first layer;
    forming a first semiconductor element layer over the second layer;
    forming a first insulating layer over the first semiconductor element layer;
    forming a first through hole reaching the first layer in the first insulating layer;
    oxidizing a portion of the first layer which is exposed at a bottom of the first through hole;
    forming a first wiring electrically connected to the first semiconductor element layer over the first insulating layer and in the first through hole;
    separating the first layer and the first substrate from the second layer, the first semiconductor element layer, the first insulating layer, and the first wiring, thereby exposing a portion of the first wiring;
    forming a third layer over a second substrate;
    forming a fourth layer on the third layer;
    forming a second semiconductor element layer over the fourth layer; and
    providing an anisotropic conductive adhesive between the second semiconductor element layer and the first wiring,
    wherein the first semiconductor element layer and the second semiconductor element layer are electrically connected to each other through the anisotropic conductive adhesive and the first wiring.

5. The method for manufacturing a semiconductor device, according to claim 4,
    wherein each of the first layer and the third layer comprises tungsten, and
    wherein each of the second layer and the fourth layer comprises silicon oxide.

6. The method for manufacturing a semiconductor device, according to claim 4, wherein the oxidizing is performed by soaking in a hydrogen peroxide solution or by irradiation with oxygen plasma.

7. The method for manufacturing a semiconductor device, according to claim 4, further comprising steps of:
    after forming the second semiconductor element layer, forming a second insulating layer over the second semiconductor element layer;
    forming a second through hole reaching the third layer in the second insulating layer;
    oxidizing a portion of the third layer which is exposed at a bottom of the second through hole; and
    forming a second wiring electrically connected to the second semiconductor element layer over the second insulating layer and in the second through hole before providing the anisotropic conductive adhesive.

8. A method for manufacturing a semiconductor device, comprising the steps of:
    forming a first layer over a first substrate;
    forming a second layer on the first layer;
    forming a first semiconductor element layer over the second layer;
    forming a first insulating layer over the first semiconductor element layer;
    forming a first through hole reaching the first layer in the first insulating layer;
    oxidizing a portion of the first layer which is exposed at a bottom of the first through hole;
    forming a first wiring electrically connected to the first semiconductor element layer over the first insulating layer and in the first through hole;
    separating the first layer and the first substrate from the second layer, the first semiconductor element layer, the first insulating layer, and the first wiring, thereby exposing a portion of the first wiring;
    forming a third layer over a second substrate;
    forming a fourth layer on the third layer;
    forming a second semiconductor element layer over the fourth layer;
    providing an anisotropic conductive adhesive between the second semiconductor element layer and the first wiring; and
    separating the third layer and the second substrate from the fourth layer, the first semiconductor element layer, and the second semiconductor element layer,
    wherein the first semiconductor element layer and the second semiconductor element layer are electrically connected to each other through the anisotropic conductive adhesive and the first wiring.

9. The method for manufacturing a semiconductor device, according to claim 8,
    wherein each of the first layer and the third layer comprises tungsten, and
    wherein each of the second layer and the fourth layer comprises silicon oxide.

10. The method for manufacturing a semiconductor device, according to claim 8, wherein the oxidizing is performed by soaking in a hydrogen peroxide solution or by irradiation with oxygen plasma.

11. The method for manufacturing a semiconductor device, according to claim 8, further comprising steps of:
- after forming the second semiconductor element layer, forming a second insulating layer over the second semiconductor element layer;
- forming a second through hole reaching the third layer in the second insulating layer;
- oxidizing a portion of the third layer which is exposed at a bottom of the second through hole; and
- forming a second wiring electrically connected to the second semiconductor element layer over the second insulating layer and in the second through hole before providing the anisotropic conductive adhesive.

* * * * *